United States Patent
Le Gallo-Bourdeau et al.

(10) Patent No.: US 10,522,223 B1
(45) Date of Patent: Dec. 31, 2019

(54) RESISTIVE MEMORY DEVICE FOR MATRIX-VECTOR MULTIPLICATIONS

(71) Applicant: International Business Machines Corporation, Armonk, NY (US)

(72) Inventors: Manuel Le Gallo-Bourdeau, Zurich (CH); Abu Sebastian, Adliswil (CH); Lukas Kull, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/027,347

(22) Filed: Jul. 4, 2018

(51) Int. Cl.
G11C 13/00 (2006.01)

(52) U.S. Cl.
CPC ........ *G11C 13/0069* (2013.01); *G11C 13/003* (2013.01); *G11C 13/004* (2013.01); *G11C 13/0026* (2013.01); *G11C 13/0028* (2013.01)

(58) Field of Classification Search
CPC ............ G11C 13/0069; G11C 13/0028; G11C 13/0026; G11C 13/004; G11C 13/003
See application file for complete search history.

(56) References Cited

U.S. PATENT DOCUMENTS

| | | | |
|---|---|---|---|
| 9,691,479 B1 | 6/2017 | Merced Grafals | |
| 2009/0086530 A1* | 4/2009 | Chung | G11C 11/16 365/158 |
| 2013/0339649 A1* | 12/2013 | Hsu | G06F 3/14 711/170 |

FOREIGN PATENT DOCUMENTS

| | | |
|---|---|---|
| WO | 2016175744 | 11/2016 |
| WO | 2017131651 | 8/2017 |

OTHER PUBLICATIONS

Miao Hu et al., Dot-Product Engine for Neuromorphic Computing: Programming 1T1M Crossbar to Accelerate Matrix-Vector Multiplication, Proceeding DAC '16 Proceedings of the 53rd Annual Design Automation Conference Article No. 19, Austin, Texas—Jun. 5-9, 2016 pp. 1-6.
Patrick M. Sheridan, Sparse coding with memristor networks. Nature Nanotechnology, May 22, 2017, DOI: 10.1038/NNANO. 2017.83 pp. 1-7.
Klavik, Pavel, et al. "Changing computing paradigms towards power efficiency." Phil. Trans. R. Soc. A 372.2018 (2014): 20130278. pp. 1-13.

(Continued)

*Primary Examiner* — Mohammed A Bashar
(74) *Attorney, Agent, or Firm* — Daniel P. Morris; Otterstedt, Wallace & Kammer, LLP

(57) ABSTRACT

A matrix-vector multiplication device includes a memory crossbar array with row lines, column lines, and junctions. Each junction comprises a programmable resistive element and an access element. A signal generator is configured to apply programming signals to the resistive elements to program conductance values for the matrix-vector multiplication and a readout circuit is configured to apply read voltages to the row lines and to read out current values of the column lines. Control circuitry is configured to control the signal generator and the readout circuit and to select, via the access terminals, a plurality of resistive elements in parallel according to a predefined selection scheme which applies the signals and/or the read voltages in parallel to resistive elements which do not share the same row and column line and applies the programming signals and/or the read voltages to at most one resistive element per row line and column line.

20 Claims, 9 Drawing Sheets

(56) References Cited

OTHER PUBLICATIONS

Di Ventra et al., "The parallel approach", Nature Physics, v. 9, Apr. 2013, p. 200-202, https://www.nature.com/articles/nphys2566.

Traversa et al., "Universal Memcomputing Machines", IEEE Transactions on Neural Networks and Learning Systems, v. 26, n. 11, Nov. 2015, p. 2702-2715, https://ieeexplore.ieee.org/document/7029665.

Traversa et al., "Memcomputing NP-complete problems in polynomial time using polynomial resources and collective states", Science Advances, v. 1, n. 6, Jul. 2015, e1500031, 8 pages, https://advances.sciencemag.org/content/1/6/e1500031.full.

Traversa et al., "Polynomial-time solution of prime factorization and NP-complete problems with digital memcomputing machines", Chaos: An Interdisciplinary Journal of Nonlinear Science, Feb. 2017, v. 27, n. 2, 023107, 22 pages, https://aip.scitation.org/doi/10.1063/1.4975761.

Di Ventra et al., "Perspective: Memcomputing: Leveraging memory and physics to compute efficiently", Journal of Applied Physics, v. 123, n. 18, May 2018, 180901, 15 pages, https://aip.scitation.org/doi/10.1063/1.5026506.

Burr et al., "Neuromorphic computing using non-volatile memory", Advanced in Physics: X, v. 2, n. 1, 2017, p. 89-124, https://www.tandfonline.com/doi/full/10.1080/23746149/016.1259585.

Sebastian et al., "Temporal correlation detection using computational phase-change memory", v. 8, Oct. 2017, 1115, 10 pages, https://www.nature.com/articles/s41467-017-01481-9.

Le Gallo et al., "Mixed-precision in-memory computing", Nature Electronics, v. 1, Apr. 2018, p. 246-253, https://www.nature.com/articles/s41928-018-0054-8.

Nandakumar et al., "Mixed-precision architecture based on computational memory for training deep neural networks", 2018 IEEE International Symposium on Circuits and Systems (ISCAS), May 2018, https://ieeexplore.ieee.org/document/8351656.

\* cited by examiner

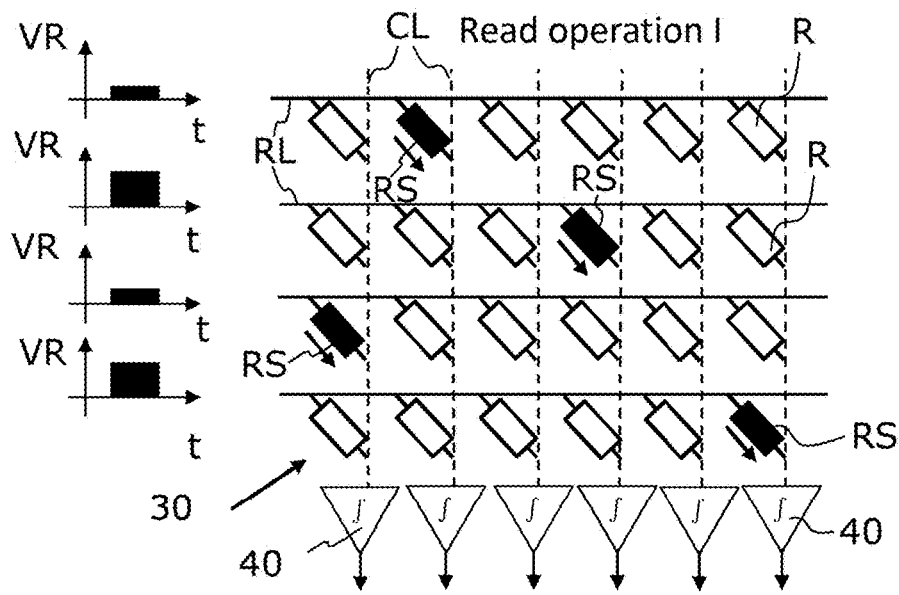
FIG. 5      500
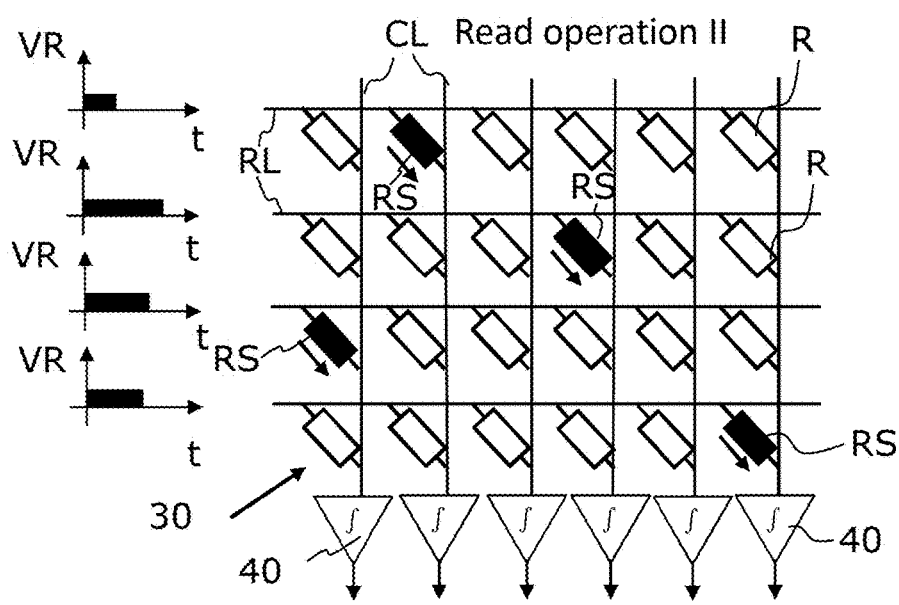
FIG. 6      600

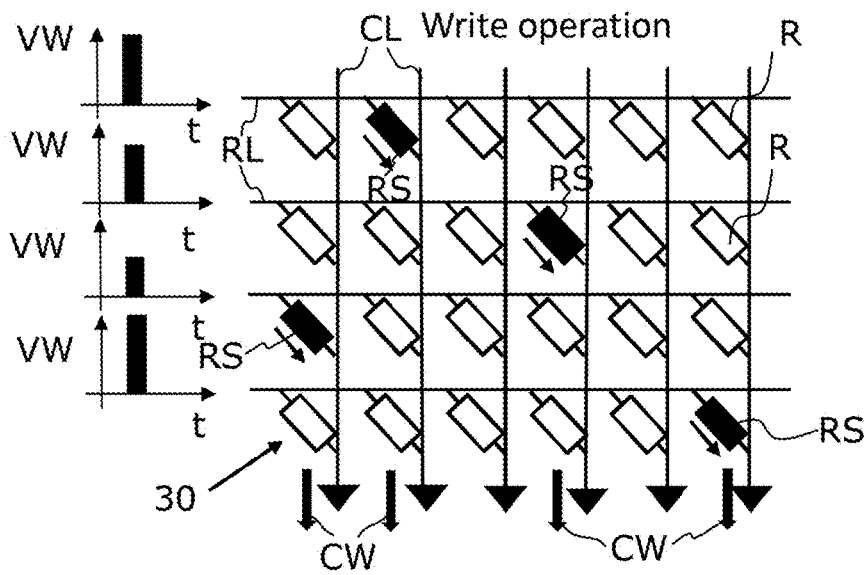
FIG. 7     700
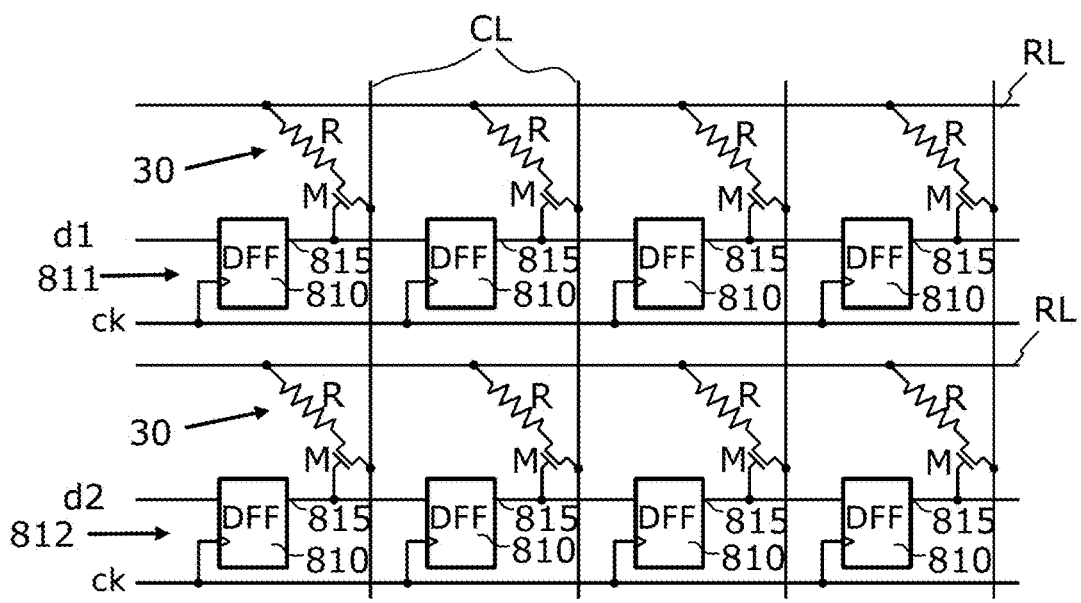
FIG. 8     800

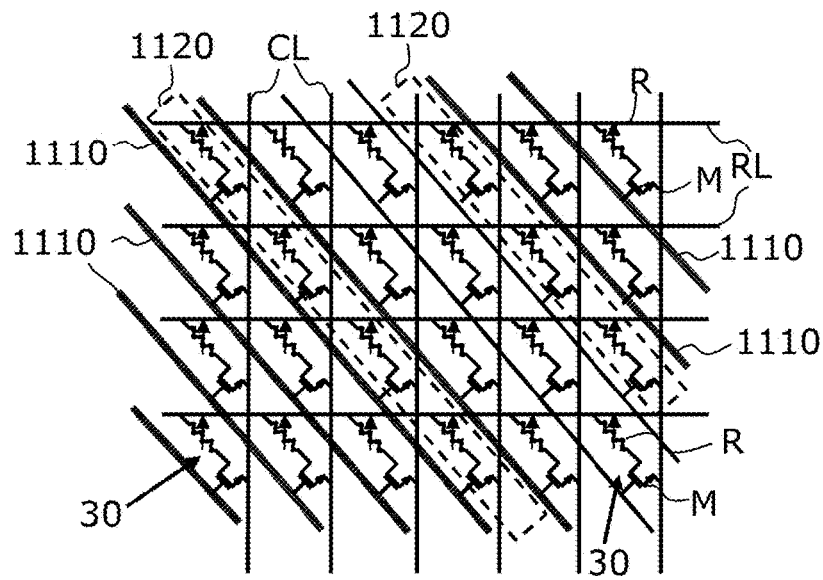
FIG. 11          1100
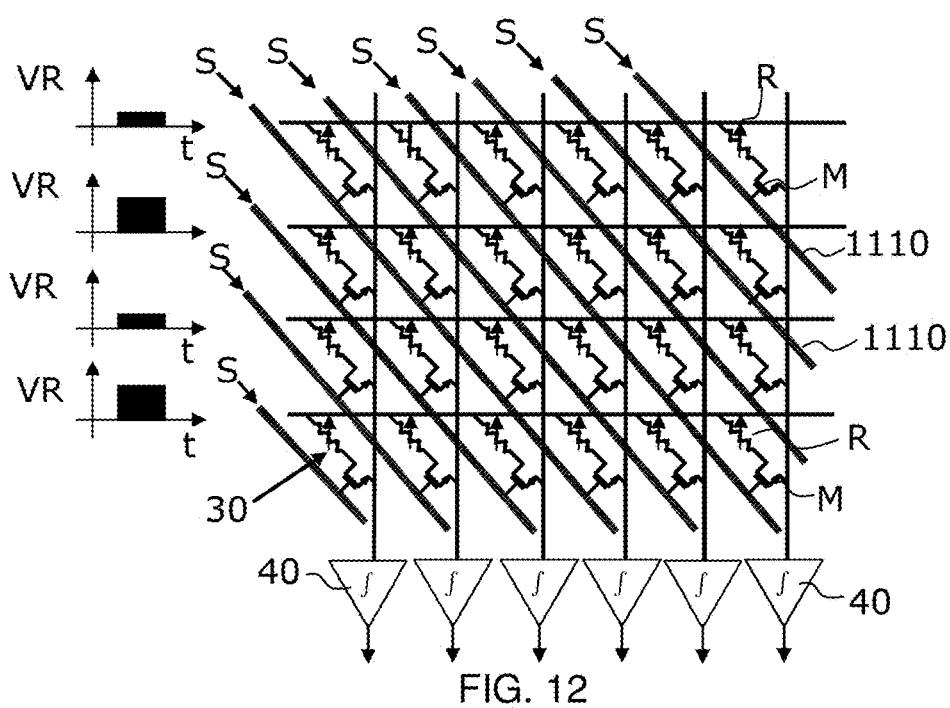
FIG. 12          1100

12
RESISTIVE MEMORY DEVICE FOR MATRIX-VECTOR MULTIPLICATIONS

BACKGROUND

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a key non-Von Neumann approach being researched. A key element in this novel computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

However, many challenges remain to be solved in order to perform accurate matrix-vector computations in an array of memory devices in an efficient way.

Accordingly, there is a need for new and improved memcomputing devices, in particular for memcomputing devices that can perform matrix-vector multiplications.

SUMMARY

According to a first aspect, the invention is embodied as device for performing a matrix-vector multiplication of a matrix with a vector. The device comprises a memory crossbar array comprising a plurality of row lines, a plurality of column lines and a plurality of junctions arranged between the plurality of row lines and the plurality of column lines. Each junction comprises a programmable resistive element and an access element comprising an access terminal for accessing the programmable resistive element. The device further comprises a signal generator configured to apply programming signals to the resistive elements to program conductance values for the matrix-vector multiplication and a readout circuit configured to apply read voltages to the row lines of the memory crossbar array and to read out current values of column lines of the memory crossbar array. The device further comprises control circuitry configured to control the signal generator and the readout circuit and to select by means of the access terminals a plurality of resistive elements in parallel according to a predefined selection scheme. The predefined selection scheme is configured to apply the programming signals and/or the read voltages in parallel to a plurality of resistive elements which do not share the same row line nor the same column line and to apply the programming signals and/or the read voltages to at most one resistive element per row line and at most one resistive element per column line.

According to another aspect a design structure is provided. The design structure is tangibly embodied in a machine readable medium for designing, manufacturing, or testing an integrated circuit. The design structure comprises a device according to the first aspect.

Embodiments of the invention will be described in more detail below, by way of illustrative and non-limiting examples, with reference to the accompanying drawings.

BRIEF DESCRIPTION OF THE DRAWINGS

FIG. 5 shows a schematic illustration of a selection scheme for performing read operations by a memory crossbar array;

FIG. 6 shows another schematic illustration of a selection scheme for performing read operations by a memory crossbar array;

FIG. 7 shows a schematic illustration of a selection scheme for performing write operations by a memory crossbar array;

FIG. 8 shows a memory crossbar array which comprises a plurality of memory blocks;

FIG. 11 shows a more detailed embodiment of a crossbar array that may be used to implement a diagonal selection scheme;

FIG. 12 illustrates the computation of a matrix vector multiplication performed by the memory crossbar array of FIG. 11;

DETAILED DESCRIPTION

In reference to FIGS. 1-18, some general aspects and terms of embodiments of the invention are described.

According to embodiments of the invention, a resistive element may be defined as an element whose electrical resistance can be changed by applying an electrical programming signal to the resistive element. The resistive element may be in particular embodied as resistive memory element. The electrical programming signal may be e.g. a current flowing through the resistive memory element, or an electrical voltage applied to the resistive memory element. The current and/or voltage may be e.g. applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Embodiments of the invention provide a way to do inexact fast matrix multiplications. The result from this multiplication may preferably be used in algorithms that do not require high precision for multiplication tasks. Such an algorithm that could be used for the post-processing of the results of the multiplication according to embodiments of the invention is e.g. the algorithm disclosed by Klavik et al. in "Changing Computing Paradigms Towards Power Efficiency", Proc. Royal Society A., 2014. The multiplication performed according to embodiments of the invention can be fast, low-power and may be scalable to matrix sizes of 10000×10000 and beyond.

Furthermore, embodiments of the invention provide devices that can perform matrix-vector multiplications with reduced complexity.

Embodiments of the invention may bring significant power and/or speed advantages compared to the conventional Von-Neumann approach where the data has to be shuttled back and forth between a central processing unit (CPU) and the memory.

As a matrix-vector multiplication can be generalized to a matrix-matrix multiplication and to a vector-vector multiplication, the device and the methods according to embodiments of the invention can also be used to perform matrix-matrix multiplications and vector-vector multiplications.

Figure 1:
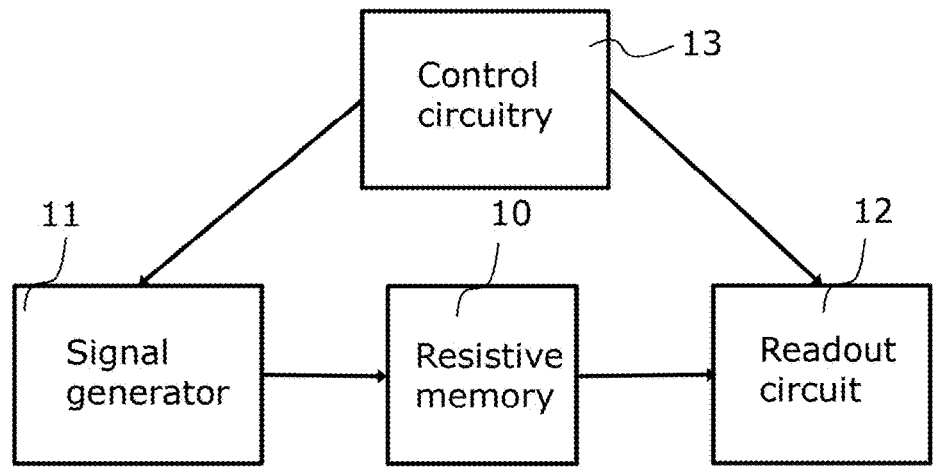
FIG. 1 is a simplified schematic block diagram of a device for performing a multiplication of a matrix with a vector according to an embodiment of the invention.

FIG. 1 is a simplified schematic block diagram of a device 100 for performing a multiplication of a matrix with a vector. The device 100 comprises a resistive memory 10 having a plurality of resistive memory elements. Furthermore, a signal generator 11 is provided. The signal generator 11 is configured to apply electrical programming signals to the resistive memory elements of the resistive memory 10. The signal generator 11 comprises circuitry for programming the resistive memory cells during data write or programming operations such that a multiplication of a matrix with a vector can be performed. The row lines and column lines may also be denoted as word and bit lines. The signal generator 11 is configured to receive a matrix A as input and to apply programming signals to the resistive memory elements to program conductance values of the resistive memory elements for a matrix-vector multiplication.

The conductance values represent matrix values of the matrix that shall be multiplied with the vector.

In addition, the device 100 comprises a readout circuit 12 configured to read out resistance values of the resistive memory elements during data read operations. The device 100 is configured to apply read out voltages to the rows of the memory crossbar array. The read out voltages represent vector elements of the vector that shall be multiplied with the matrix. The device is further configured to read out current values of columns of the memory array. The current values represent result values of vector elements of a result vector of the multiplication.

The device 100 further comprises control circuitry 13 configured to control the signal generator 11 and the readout circuit 12. The control circuitry 13 is in particular configured to select in parallel a plurality of resistive elements of the resistive memory 10 according to a predefined selection scheme. The predefined selection scheme is configured to apply the programming signals and/or the read voltages in parallel to a plurality of resistive elements which do not share the same row line nor the same column line. Furthermore, according to the predefined selection scheme the programming signals and/or the read voltages are applied to at most one resistive element per row line and at most one resistive element per column line.

The memory 10 may be generally any kind of resistive memory as described above. In particular it may be a phase change memory (PCM) or a resistive random access memory (RRAM). In the following it assumed that the resistive memory 10 is embodied as PCM. Accordingly the resistive memory 10 comprise a plurality of PCM cells as resistive memory elements. The PCM cells of memory 10 may comprise s=2 or s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states are typically defined in terms of predetermined reference values, or ranges of values, of the resistance metric used for read detection by the readout circuit 12.

To perform a matrix-vector multiplication, the PCM cells are programmed according to embodiments in a kind of write operation. More particularly, the signal generator 11 applies a voltage to the cell via the column lines and row lines such that the resulting programming signal sets the cell to a state (conductance value) that represents a matrix element of the matrix that shall be multiplied with the vector. In a read operation, (lower) read voltages are applied to the row lines. Then the resulting column current values of the column lines are read/measured to obtain the result vector.

Figure 2:
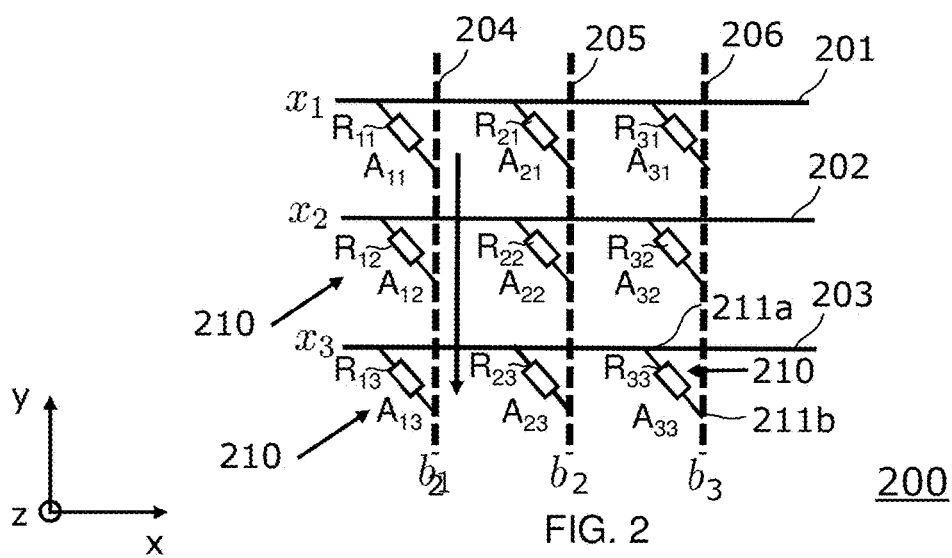
FIG. 2 illustrates an example of matrix-vector multiplication according to an embodiment of the invention.

FIG. 2 illustrates an example of a matrix multiplication according to an embodiment of the invention. The matrix multiplication uses Ohm's law and Kirchhoff's law in a resistive memory crossbar array.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$ The vector x comprises the vector elements $x_1$, $x_2$ and $x_3$.

For such a multiplication of the matrix A with the size 3×3, the resistive memory 10 comprises a memory crossbar array 200 of a corresponding size 3×3.

The memory crossbar array 200 comprises 3 row lines 201, 202 and 203 and three column lines 204, 205 and 206. The three row lines 201, 202 and 203 are arranged above the three column lines 204, 205 and 206 which is indicated by dotted lines. More particularly, the row lines 201, 202 and 203 extend in a first x-y-plane and the three column lines extend in a second x-y plane, wherein the first x-y plane is arranged in the vertical z-direction above the second x-y-plane.

The three row lines 201, 202 and 203 and the three column lines 204, 205 and 206 are connected to each other via vertical junctions 210. The junctions 210 extend in the vertical z-direction between upper cross points 211a of the row lines 201-203 and lower cross points 211b of the column lines 204-206.

Each junction 210 comprises a serial arrangement of a resistive memory element and a transistor. For ease of illustration, the transistors are not shown in FIG. 2.

More particularly, the crossbar array 200 comprises 9 resistive memory elements embodied as PCM cells. The column line 204 comprises resistive memory elements $R_{11}$, $R_{12}$ and $R_{13}$, the column line 205 comprises the memory elements $R_{21}$, $R_{22}$ and $R_{23}$ and the column line 206 the memory elements $R_{31}$, $R_{32}$ and $R_{33}$.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element $R_{11}$ is programmed to the matrix value $A_{11}$, the conductance of the resistive memory element $R_{12}$ is programmed to the matrix value $A_{12}$, or more generally the conductance of the resistive memory Rij is programmed to a corresponding matrix value Aij.

Then the readout circuit 12 applies read voltages to the row lines 201, 202 and 203. More particularly, the readout circuit 12 applies a read voltage $X_1$ to the row line 201, a read voltage $X_2$ to the row line 202 and a read voltage $X_3$ to the row line 203. Hence the read voltages represent vector values of the vector of the matrix-vector multiplication.

Furthermore, the readout circuit 12 reads out current values of the column lines 204, 205 and 206. As an example, the readout circuit 12 reads out a current value $b_1$ from the column line 204, which is the sum of three multiplications, namely $$b_1 = A_{11}x_1 + A_{12}x_2 + A_{13}x_3.$$

Accordingly, the readout circuit 12 reads out a current value $b_2$ from the column line 205 and a current value $b_3$ from the column line 206. The current values represent the result values of the vector elements of the product vector b.

Figure 3:
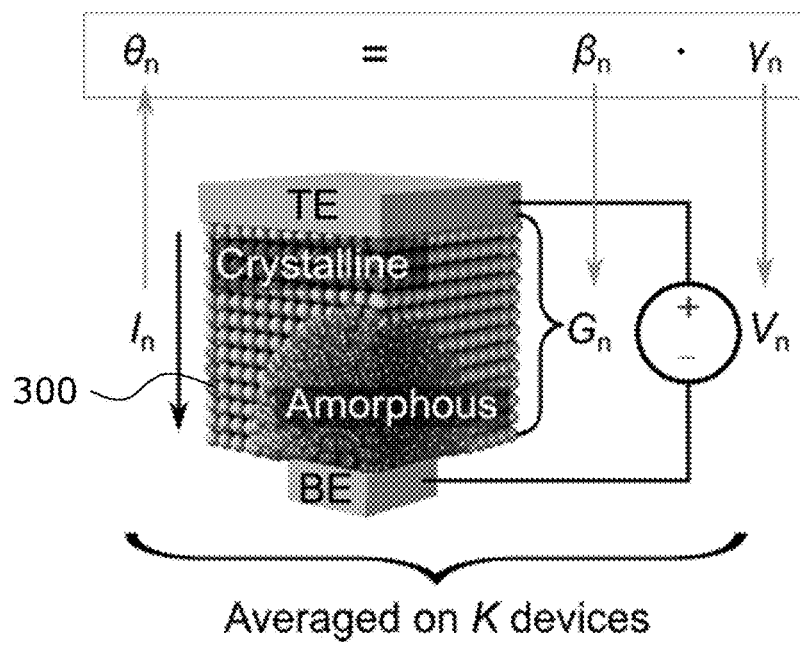
FIG. 3 illustrates an exemplary embodiment of a scalar multiplication to be performed by a phase change memory cell.

FIG. 3 illustrates an exemplary embodiment of a scalar multiplication that may be performed by a PCM cell 300. Such a scalar multiplication forms the basis of the matrix-vector multiplication performed according to embodiments of the invention. Let, $$\theta_n = \beta_n \cdot \gamma_n$$

where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 is a slightly non-linear function of the voltage, the analogue scalar multiplication may be expressed to follow a "pseudo" OHM's law, namely by $$I_n \cong \alpha G_n \cdot f(V_n).$$

In this equation, $\alpha$ is a time dependent conductance variation parameter and f a function, in particular a polynomial function that approximates the current-voltage characteristics of the PCM cell 300. The PCM cell 300 may be programmed to the effective conductance $G_n$ by an iterative program and verify procedure. Then the readout circuit 12 may apply a read voltage $V_n$ and readout the current $I_n$. Finally, the current $I_n$ is converted back to approximate the value $\hat{\theta}_n$, representing the result of the scalar multiplication.

According to preferred embodiments, an averaging of the result over K memory elements/PCM cells is performed. In some embodiments, the device is configured to perform multiple runs for the matrix-vector multiplication, and to perform an averaging of result values of the multiple runs.

Figure 4:
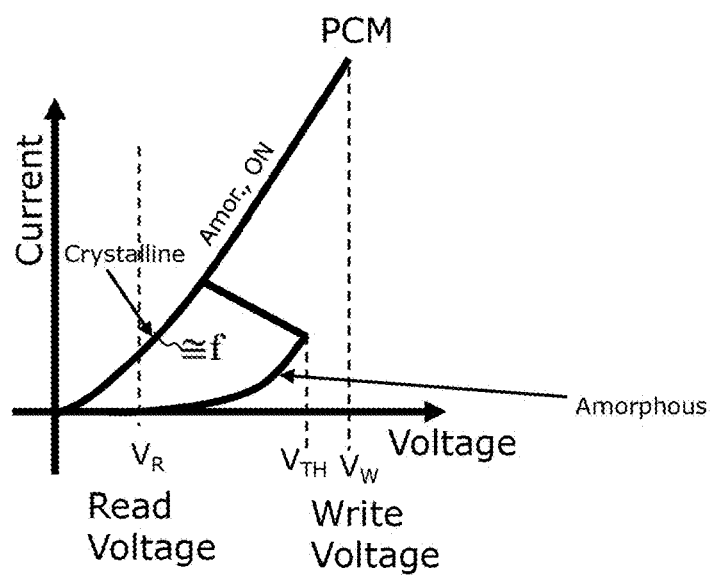
FIG. 4 is a schematic illustration of the current/voltage characteristics of the material components of the phase change memory cell of FIG. 3.

FIG. 4 is a schematic illustration of the current/voltage (and hence resistance) characteristics of the material components of the memory cell 300 of FIG. 3. The solid lines indicate variation of current with voltage for the PCM material, starting from the fully-crystalline SET state (upper curve) and also the fully-amorphous RESET state (lower curve). These two curves reflect the large (typically 3 orders of magnitude) variation in resistivity between the crystalline and amorphous phases. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated.

As can be seen in FIG. 4, the current in the read mode is a slightly non-linear function of the voltage.

FIG. 5 shows a schematic illustration of a selection scheme for performing read operations by a memory crossbar array 500. The memory crossbar array comprises a plurality of row lines RL, a plurality of columns lines CL and a plurality of junctions 30 comprising a serial arrangement of a resistive element R and a transistor. For ease of illustration, the transistors are not shown in FIG. 5. The applied selection scheme may be e.g. performed by the control circuitry 13 of FIG. 1. The read circuit 12, under control of the control circuitry 13, applies to each row line RL a read voltage VR in the form of read pulses. The information of the read pulses is in this example encoded by the height of the read pulses. The array 500 comprises means to select multiple resistive memory elements in parallel that do not share the same rows nor the same columns. In this example only the 4 resistive elements which are illustrated in black are selected by the control circuitry 13 for the read operations. The selected resistive elements are denoted as RS and in addition marked with an arrow. As a result, the read voltages VR are applied in parallel to the resistive elements RS which do not share the same row line nor the same column line and the resistive elements RS can be read individually in parallel in a single step by integrating units 40.

FIG. 6 shows a schematic illustration of a selection scheme for performing read operations by a memory crossbar array 600. The memory crossbar array 600 corresponds to the memory crossbar array 500 of FIG. 5. Again the read circuit 12, under control of the control circuitry 13, applies to each row line RL a read voltage VR in the form of read pulses. According to this embodiment the information of the read pulses is encoded by the duration of the read pulses. The read voltages VR of different length are applied in parallel to the 4 selected resistive elements RS, again illustrated in black and marked with an arrow, which do not share the same row line nor the same column line. Accordingly, the selected resistive elements RS can be read individually in parallel in a single step by the integrating units 40.

FIG. 7 shows a schematic illustration of a selection scheme for performing write operations by a memory crossbar array 700. The memory crossbar array 700 corresponds to the memory crossbar array 500 of FIG. 5. The signal generator 11 applies, under control of the control circuitry 13, to each row line RL a programming signal, in particular a write voltage VW in the form of write pulses. The information to be written by the write voltages VW is encoded in the amplitude of the write pulses. The write voltages VW of different amplitude are applied in parallel to 4 selected resistive elements RS, again illustrated in black and marked with an arrow, which do not share the same row line nor the same column line. The write operation may be performed by single shot programming or iterative programming. During single shot programming, a resulting write current CW along a column is only applied to the corresponding selected resistive element RS. During iterative programming, a sequence of write voltages VW with varying amplitude and read voltages VR for verifying the programmed resistance can be applied individually to the selected devices RS.

FIG. 8 shows a memory crossbar array 800 which comprises a plurality of memory blocks 810. The memory crossbar array 800 comprises a plurality of row lines RL, a plurality of columns lines CL and a plurality of junctions 30 comprising a serial arrangement of a resistive memory element R and an access transistor M, which may be in particular embodied as MOSFET. The memory blocks 810 are embodied as flip-flops, in particular D-flip flops and are hence also denoted with DFF. The memory blocks 810 are arranged in rows of memory blocks. In the illustrated example a row 811 and a row 812 of memory blocks 810 is provided. Each of the rows 811, 812 of memory blocks 810 is configured as shift register. Each memory block 810 is allocated to a corresponding junction 30 and an output 815 of each memory block 810 is coupled to the gate of the corresponding access transistor M of the corresponding junction 30. The memory blocks 810 of each row 811 are clocked with a shared clock signal ck. Furthermore, a control data signal d1 is applied to the row 811 of memory blocks and a control data signal d2 to the row 812. The control data of the control data signals d1, d2 can be programmed in such a way that a desired selection scheme of the resistive memory elements is achieved. More particularly, the output of each memory block 810 is connected to the data input of the next memory block in the chain, e.g. the respective row 811 or 812. As a result, the shift registers shifts the respective control data input (d1, d2) by one position at each transition of the clock signal ck. Such an approach provides the particular advantage of a reduction of the wiring area.

According to embodiments, the shift register is programmed/controlled in such a way by the control data that a diagonal selection scheme is achieved. Such a diagonal selection scheme can be efficiently programmed. More particularly, after a first diagonal selection line has been programmed, each further clock cycle shifts the diagonal selection line by one. As a simple example, in case of a matrix with a first, a second and a third row line, a control data input 100 for a first shift register allocated to the first row line, a control data input 010 for a second shift register allocated to the second line and a control data input 001 for a third shift register allocated to the third row line implements a diagonal selection of the corresponding resistive elements that is shifted by one resistive element to the right per clock cycle.

The output signals of the memory blocks 810 which are coupled to the gate of the corresponding access transistor M enable or disable the corresponding resistive memory element prior to programming and reading the resistive memory element. According to embodiments (not shown) the memory blocks may be connected to multiple access transistors of multiple resistive memory elements.

Figure 9:
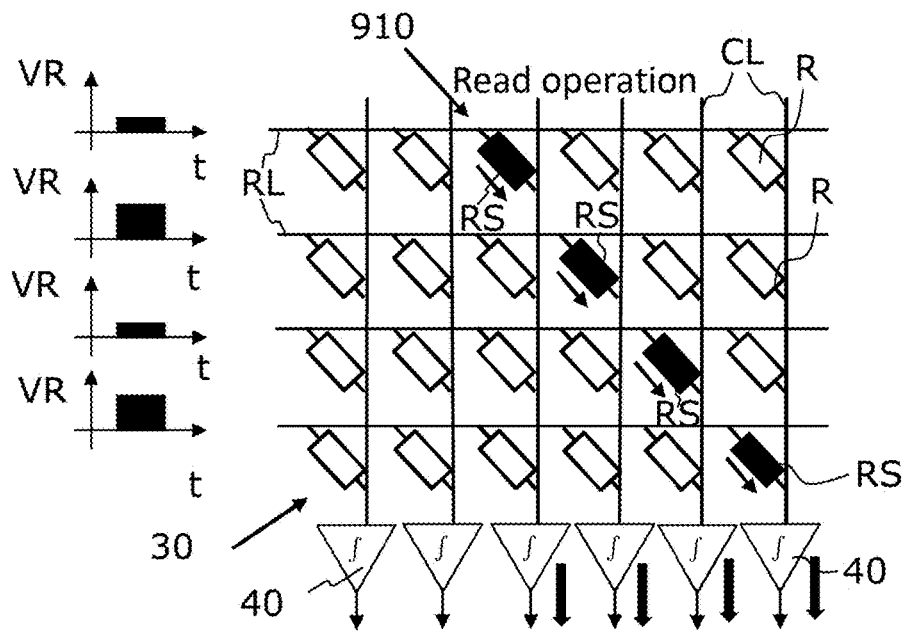
FIG. 9 shows a schematic illustration of a selection scheme for performing read operations by a memory crossbar array.

FIG. 9 shows a schematic illustration of a selection scheme for performing read operations by a memory crossbar array 900. The memory crossbar array 900 comprises a plurality of row lines RL, a plurality of columns lines CL and a plurality of junctions 30 comprising a serial arrangement of a resistive memory element R and a transistor. For ease of illustration, the transistors are not shown in FIG. 9. The applied selection scheme may be e.g. performed by the control circuitry 13 of FIG. 1. The read circuit 12, under control of the control circuitry 13, applies to each row line RL a read voltage VR in the form of read pulses. The information of the read pulses is in this example encoded by the height of the read pulses. The array 900 comprises means to select multiple resistive memory elements in parallel that do not share the same rows nor the same columns. According to this embodiment 4 resistive elements RS of a diagonal 910 of the memory crossbar array 900 are selected. The selected resistive elements are illustrated in black and in addition marked with an arrow. The read voltages VR are applied in parallel to the selected resistive elements RS of the diagonal 910 and can be read individually in parallel in a single step by integrating units 40.

Figure 10:
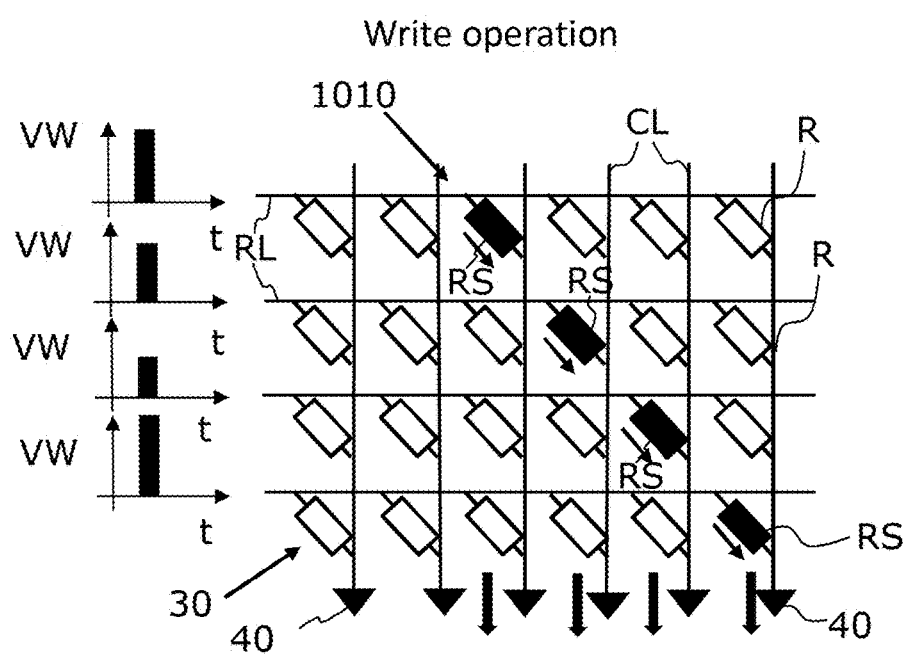
FIG. 10 shows a schematic illustration of a selection scheme for performing write operations by a memory crossbar array.

FIG. 10 shows a schematic illustration of a selection scheme for performing write operations by a memory crossbar array 1000. The memory crossbar array 1000 corresponds to the memory crossbar array 900 of FIG. 9. The signal generator 11 applies, under control of the control circuitry 13, to each row line RL a programming signal, in particular a write voltage VW in the form of write pulses. The information to be written by the write pulses is encoded in the amplitude of the write pulses. The write voltages VW of different amplitudes are applied in parallel to 4 selected resistive elements RS of a selected diagonal 1010. The write operation may be performed by single shot programming or iterative programming.

FIG. 11 shows a more detailed embodiment of a crossbar array 1100 that may be used to implement the diagonal selection scheme as illustrated with reference to FIGS. 9 and 10.

The memory crossbar array 1100 comprises a plurality of row lines RL, a plurality of columns lines CL and a plurality of junctions 30. Each of the junctions 30 comprise a serial arrangement of a resistive memory element R and an access transistor M, which may be in particular embodied as MOSFET.

The memory crossbar array 1100 comprises as access circuitry a plurality of diagonal access lines 1110, wherein each of the plurality of diagonal access lines 1110 is coupled to a respective array 1120 of diagonally arranged resistive memory elements R. More particularly, each diagonal access line is coupled to the gates of the access transistors M of the corresponding diagonal array 1120 of resistive memory elements R. Hence by providing an appropriate control signal to one or more of the access lines 1110, all the resistive memory elements R that are coupled to the respective access line 1110 can be simultaneously turned on or off. In FIG. 11 only two arrays 1120 are explicitly indicated for ease of illustration.

FIG. 12 illustrates the computation of a matrix vector multiplication performed by the memory crossbar array 1100 of FIG. 11.

For the matrix-vector multiplication, all access lines 1110 have been selected. This can be implemented by sending by the control circuitry 13 selection signals S to all access lines 1110. The matrix vector multiplication can then be performed with O(1) complexity.

The input of the computation, in this example the vector values of the vector of the matrix-vector multiplication may be encoded as amplitude of the voltage pulses applied to the row lines or as time duration of the voltage pulses. In the example illustrated in FIG. 12, the amplitude of the voltage pulses is used.

The result of the computation is obtained by measuring the current or an integral of the current over a fixed time duration by the integrating units 40.

Figure 13:
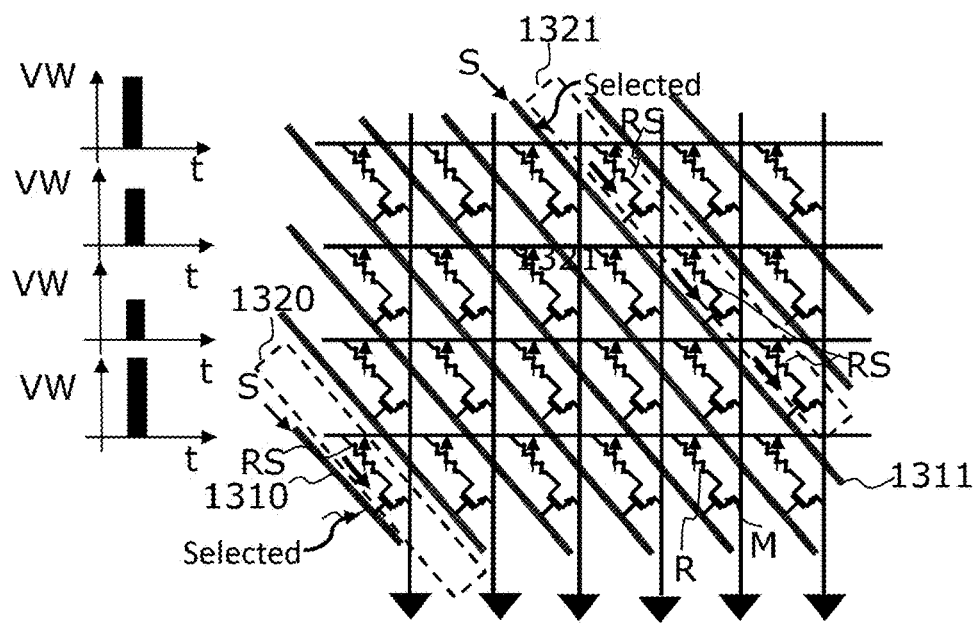
FIG. 13 illustrates a matrix programming.

FIG. 13 illustrates a matrix programming of the memory crossbar array 1100 of FIG. 11.

For the matrix-programming, the control circuitry 13 may apply a selection scheme according to which only diagonal arrays 1320 and 1321 have been selected. This can be done by sending selection signals S to only the access lines 1310 and 1311.

As a result, the 4 selected resistive elements RS can be programmed in parallel. And in general, for a N×M matrix with N columns and M rows, such a selection scheme may speed up the programming by a factor of M compared with programming schemes that program one individual cell after the other. As an example, for N=M=1000, the programming scheme according to embodiments of the invention will speed up the programming process by a factor of 1000.

The signal generator 11 may apply, under control of the control circuitry 13, to each row line RL a programming signal, in particular a write voltage VW in the form of write pulses. According to the example of FIG. 13, the information to be written by the write pulses is encoded in the amplitude of the write pulses. The write operation as illustrated in FIG. 13 may be performed by single shot programming or iterative programming. A single-shot programming may be performed with O(N) time complexity.

In iterative programming, in a first step a write operation as illustrated in FIG. 13 is performed. Then in a next step the result of the write operation is verified by a read operation.

Figure 14:
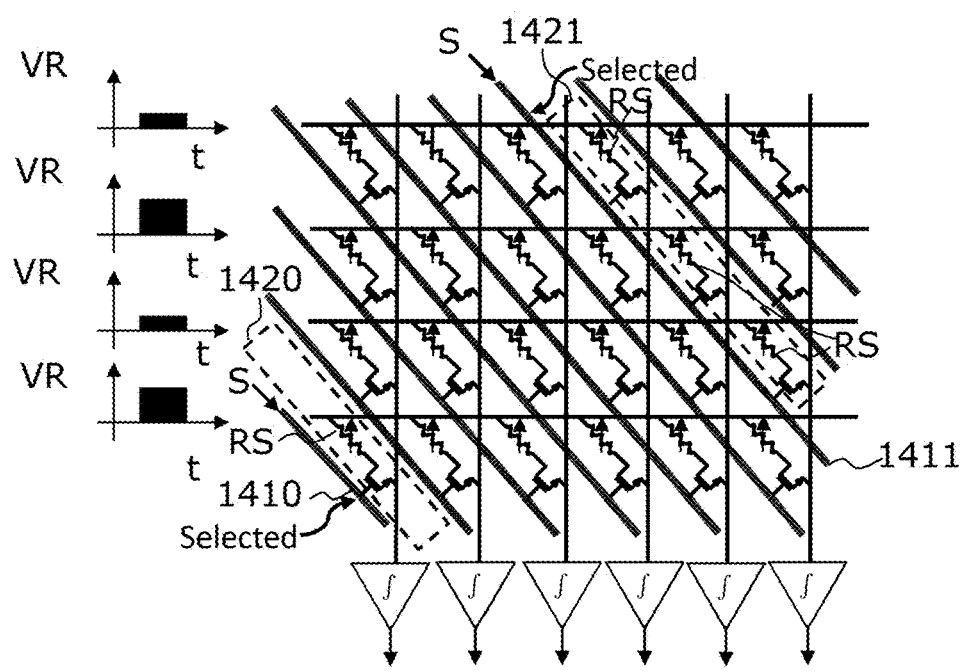
FIG. 14 illustrates a read operation of an iterative programming scheme.

FIG. 14 illustrates such a read operation of an iterative programming scheme for the memory crossbar array 1100 of FIG. 11. For the read operation, the control circuitry 13 applies a selection scheme according to which only diagonal arrays 1420 and 1421 have been selected. This can be done by sending selection signals S to only the corresponding access lines 1410 and 1411. As a result, the 4 selected resistive elements RS can be read in parallel.

This iterative process can be repeated as desired or needed until the desired resistance value has been reached for the selected resistive elements RS.

One iteration can be performed with O(2N) complexity compared to O(M(N+1)) complexity of prior art schemes that perform the iterative programming individually in a serial manner for single resistive elements.

According to other embodiments of the invention the iterative programming may also be performed with a variable read voltage which may use e.g. the voltage dependence of the conductance of the resistive memory elements.

Figure 15:
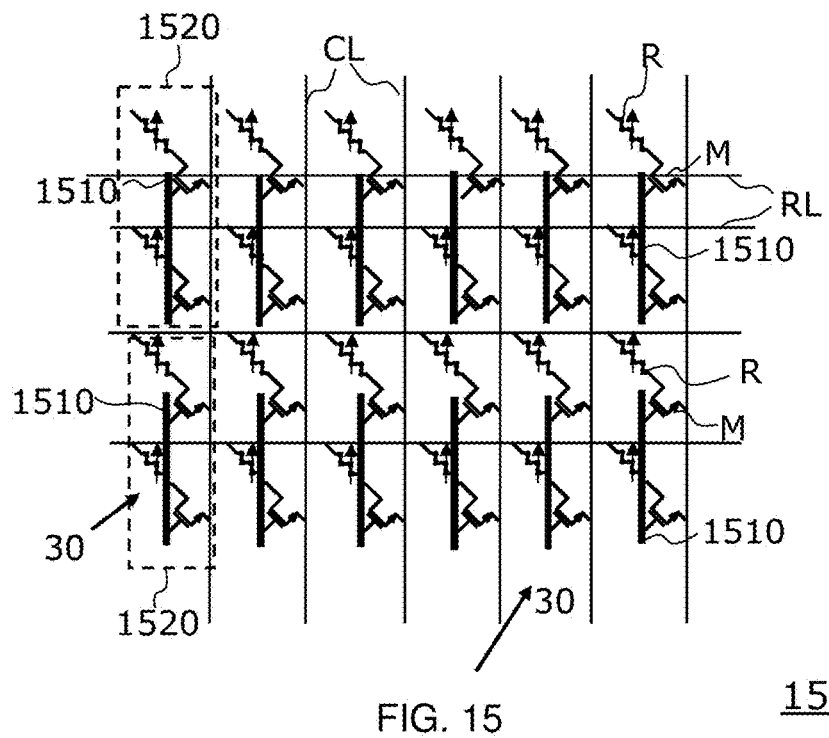
FIG. 15 shows another embodiment of a memory crossbar array.

FIG. 15 shows another embodiment of a memory crossbar array 1500. The memory crossbar array 1500 comprises a plurality of row lines RL, a plurality of columns lines CL and a plurality of junctions 30. Each of the junctions 30 comprise a serial arrangement of a resistive memory element R and an access transistor M, which may be in particular embodied as MOSFET. The memory crossbar array 1500 comprises as access circuitry a plurality of column access lines 1510 being arranged along the column lines CL of the memory crossbar array 1500. Each of the plurality of column access lines 1510 is coupled to a corresponding vertical array 1520 of resistive memory elements being arranged in a column line.

More particularly, each column access line 1510 is coupled to the gates of the access transistors M of the corresponding array 1520 of resistive memory elements R. Hence by providing an appropriate control signal to on one or more of the column access lines 1510, all the resistive memory elements R that are coupled to the respective column access line 1510 can be simultaneously turned on or off.

Figure 16:
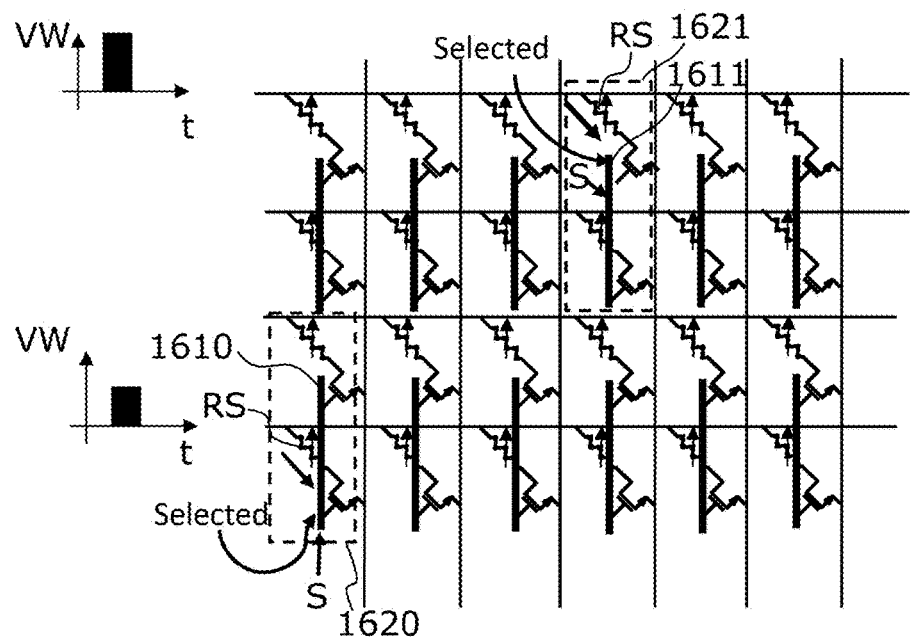
FIG. 16 illustrates a matrix programming of the memory crossbar array of FIG. 15.

FIG. 16 illustrates a matrix programming of the memory crossbar array 1500 of FIG. 15.

For the matrix-programming, the control circuitry 13 may apply a selection scheme according to which only vertical arrays 1620 and 1621 have been selected. This can be done by sending selection signals S to only the column access lines 1610 and 1611.

According to such an embodiment write voltages VW are applied only to rows which don't share the same column access lines. Hence according to the example of FIG. 16 only 2 selected resistive elements RS are programmed in parallel by the write voltages VW.

The scheme with column access lines as illustrated with reference to FIGS. 15 and 16 has a higher complexity to update all resistive elements than schemes with diagonal access lines. However, it offers more flexibility for resistive element selection which may be useful e.g. when dealing with sparse matrix updates. An iterative programming can be done in an analogous manner to the diagonal selection schemes as explained above.

Figure 17:
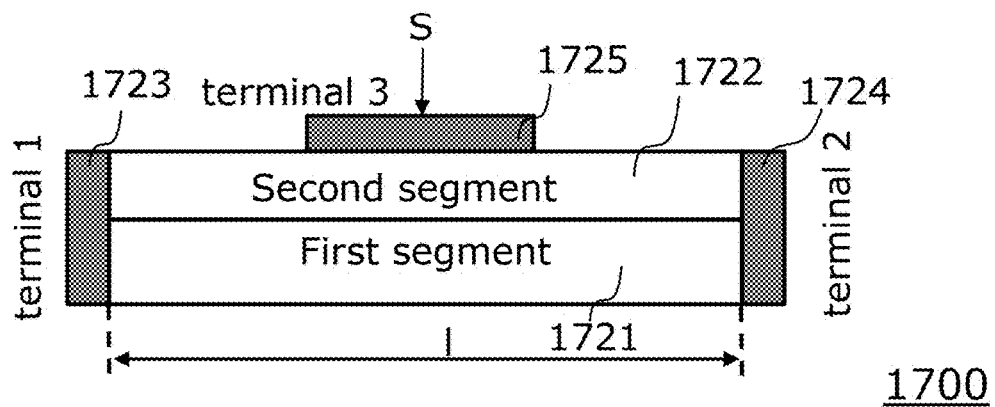
FIG. 17 shows a schematic cross-sectional view of resistive memory element which is embodied as projected memory element.

FIG. 17 shows a schematic cross-sectional view of resistive memory element 1700 which is embodied as projected memory element. The resistive memory element comprises an integrated access terminal 1725. More particularly, the resistive memory element 1700 comprises a first segment 1721 comprising a PCM material such as a chalcogenide as resistive memory material for storing information in a plurality s of resistance states which correspond to the programmable cell-states. The resistive memory element 1700 further comprises a second segment 1722 comprising an electrically non-insulating material. The first segment 1721 and the second segment 1722 are arranged in parallel between a first terminal 1723 and a second terminal 1724. In parallel to and adjacent to the second segment 1722 the integrated access terminal 1725 is provided as third terminal. The first, the second and the third terminal may be coupled to the control circuitry 13 of FIG. 1. The control circuitry 13 is adapted to apply control signals to the first, the second and the third terminal. More particularly, the control circuitry 13 is configured to apply in a write mode a write voltage to the first terminal 1723 and the second terminal 1724 for writing one of the plurality of resistance states.

Furthermore, the control circuitry 13 is configured to apply in a read mode a read voltage to the first terminal 1723 and the second terminal 1724, thereby reading the respective resistance state. In addition, the control circuitry 13 is configured to apply a control signal (selection signal S) to the third terminal 1725 for adjusting the electrical resistance of the second segment 1722. The electrical resistance of the second segment 1722 can be independently controlled by the control signals applied to the third terminal 1725. This allows to adjust the current-voltage characteristic of the second segment 1722. Providing the second segment 1722 with a variable and tunable resistance can be used to select or deselect the respective resistive element. The first segment 1721 and the second segment 1722 are arranged in electrical contact with each other over substantially the whole length l between the first and the second terminal. According to embodiments the resistance of the second segment 1722 forms a distributed resistance whose resistance per unit length of the length l can be adjusted by the control circuitry 13. In an exemplary implementation, the first segment may comprise GST as PCM material and the first and the second terminal may be formed of TiN.

Figure 18:
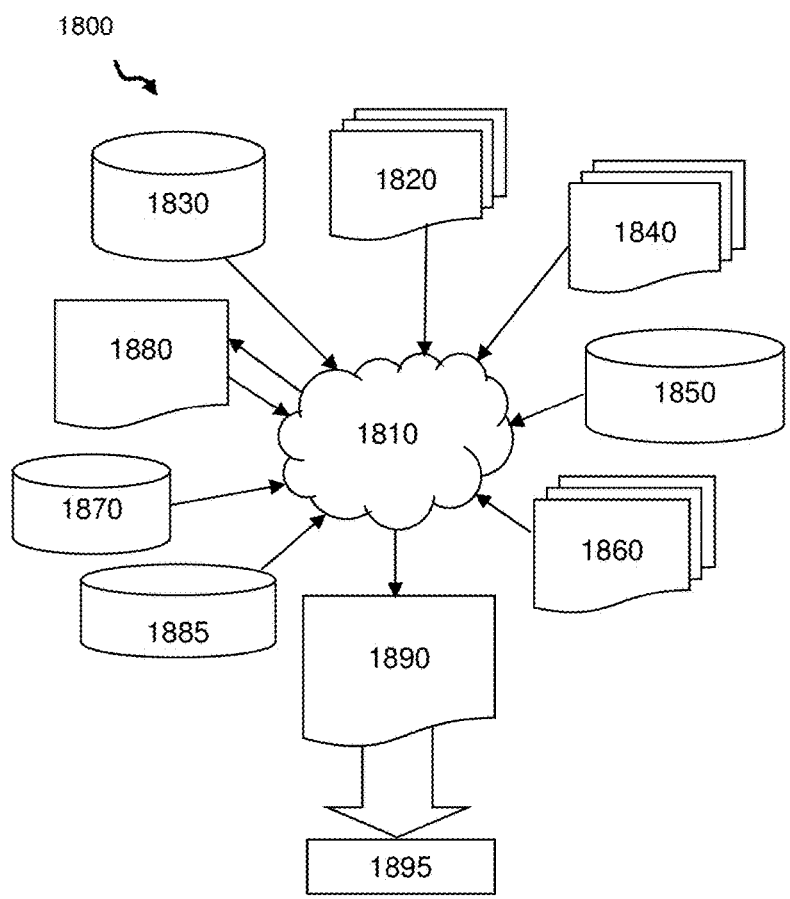
FIG. 18 shows a block diagram of an exemplary design flow.

FIG. 18 shows a block diagram of an exemplary design flow 1800 used for example, in semiconductor IC logic design, simulation, test, layout, and manufacture. Design flow 1800 includes processes, machines and/or mechanisms for processing design structures or devices to generate logically or otherwise functionally equivalent representations of the design structures and/or devices described above and shown e.g. in FIGS. 1-17. The design structures processed and/or generated by design flow 1800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1800 may vary depending on the type of representation being designed. For example, a design flow 1800 for building an application specific IC (ASIC) may differ from a design flow 1800 for designing a standard component or from a design flow 1800 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 1820 that is preferably processed by a design process 1810. Design structure 1820 may be a logical simulation design structure generated and processed by design process 1810 to produce a logically equivalent functional representation of a hardware device. Design structure 1820 may also or alternatively comprise data and/or program instructions that when processed by design process 1810, generate a functional representation of the physical structure of a hardware device. Whether representing functional and/or structural design features, design structure 1820 may be generated using electronic computer-aided design (ECAD) such as implemented by a core developer/designer. When encoded on a machine-readable data transmission, gate array, or storage medium, design structure 1820 may be accessed and processed by one or more hardware and/or software modules within design process 1810 to simulate or otherwise functionally represent an electronic component, circuit, electronic or logic module, apparatus, device, or system such as those shown in FIGS. 1-17. As such, design structure 1820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1810 preferably employs and incorporates hardware and/or software modules for synthesizing, translating, or otherwise processing a design/simulation functional equivalent of the components, circuits, devices, or logic structures shown in FIGS. 1-17 to generate a Netlist 1880 which may contain design structures such as design structure 1820. Netlist 1880 may comprise, for example, compiled or otherwise processed data structures representing a list of wires, discrete components, logic gates, control circuits, I/O devices, models, etc. that describes the connections to other elements and circuits in an integrated circuit design. Netlist 1880 may be synthesized using an iterative process in which netlist 1880 is resynthesized one or more times depending on design specifications and parameters for the device. As with other design structure types described herein, netlist 1880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1810 may include hardware and software modules for processing a variety of input data structure types including Netlist 1880. Such data structure types may reside, for example, within library elements 1830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1840, characterization data 1850, verification data 1860, design rules 1870, and test data files 1885 which may include input test patterns, output test results, and other testing information. Design process 1810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1810 without deviating from the scope and spirit of the invention. Design process 1810 may also include modules for performing standard circuit design processes such as timing analysis, verification, design rule checking, place and route operations, etc.

Design process 1810 employs and incorporates logic and physical design tools such as HDL compilers and simulation model build tools to process design structure 1820 together with some or all of the depicted supporting data structures along with any additional mechanical design or data (if applicable), to generate a second design structure 1890. Design structure 1890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1820, design structure 1890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 1890 may comprise a compiled, executable HDL simulation model that functionally simulates the devices shown in FIGS. 1-17.

Design structure 1890 may also employ a data format used for the exchange of layout data of integrated circuits and/or symbolic data format (e.g. information stored in a GDSII (GDS2), GL1, OASIS, map files, or any other suitable format for storing such design data structures). Design structure 1890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 1890 may then proceed to a stage 1895 where, for example, design structure 1890: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A memcomputing device for performing a matrix-vector multiplication of a matrix with a vector, the device comprising:
    a memory crossbar array comprising
        a plurality of row lines;
        a plurality of column lines;
        a plurality of junctions arranged between the plurality of row lines and the plurality of column lines, wherein each junction comprises a programmable resistive element and an access element comprising an access terminal for accessing the programmable resistive element;
    a signal generator configured to
        apply programming signals to the resistive elements to program conductance values representing respective elements of the matrix to be multiplied with the vector;
    a readout circuit configured to
        apply read voltages to the row lines of the memory crossbar array, wherein the read voltages represent respective elements of the vector to be multiplied with the matrix;
        read out current values of the column lines of the memory crossbar array, wherein the current values represent respective elements of a product of the matrix-vector multiplication; and
    control circuitry configured to control the signal generator and the readout circuit and to select by means of the access terminals a plurality of resistive elements in parallel according to a predefined selection scheme, wherein the predefined selection scheme is configured to
        apply the programming signals and/or the read voltages in parallel to a plurality of resistive elements which do not share the same row line nor the same column line; and
        apply the programming signals and/or the read voltages to at most one resistive element per row line and at most one resistive element per column line.

2. The device according to claim 1, wherein the device comprises access circuitry configured to apply in parallel a selection signal to a subset of the access terminals to select in parallel a subset of the resistive elements according to the predefined selection scheme.

3. The device according to claim 1, wherein the junctions comprise a serial arrangement of a resistive element and an access transistor comprising a gate as access terminal.

4. The device according to claim 1, wherein the resistive element is embodied as projected memory, the projected memory comprising an integrated access terminal.

5. The device according to claim 1, wherein the selection scheme is configured to select in parallel resistive elements of one or more diagonals of the memory crossbar array.

6. The device according to claim 5, wherein the device comprises a plurality of diagonal access lines, wherein each of the plurality of diagonal access lines is coupled to the access terminals of an array of diagonally arranged resistive elements.

7. The device according to claim 1, wherein the device comprises a plurality of column access lines, the column access lines being arranged along the column lines of the memory crossbar array, wherein each of the plurality of column access lines is coupled to the access terminals of an array of resistive elements being arranged in a column line.

8. The device according to claim 7, wherein the selection scheme is configured to apply programming signals and/or read voltages only to access terminals of row lines which do not share the same column access lines.

9. The device according to claim 1, wherein the junctions comprise a serial arrangement of a resistive element and an access transistor comprising a gate as access terminal, and wherein the device comprises a plurality of memory blocks, and wherein an output of each memory block is coupled to at least one access transistor.

10. The device according to claim 9, wherein the memory blocks are embodied as flip-flops.

11. The device according to claim 9, wherein the memory blocks are arranged in rows of memory blocks, wherein each row of memory blocks is configured as shift register.

12. The device according to claim 1, wherein an element of the vector is represented as a duration of a read voltage pulse and/or a voltage level of a read voltage pulse.

13. The device according to claim 1, wherein the device is configured
to perform multiple runs for the matrix-vector multiplication; and
to perform an averaging of result values of the multiple runs.

14. The device as claimed in claim 1, wherein the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

15. The device according to claim 1, wherein the signal generator is configured to program the conductance values of the resistive elements by an iterative program and verify procedure.

16. A design structure tangibly embodied in a machine readable medium for designing, manufacturing, or testing an integrated circuit, the design structure comprising:
a memcomputing device for performing a matrix-vector multiplication of a matrix with a vector, the device comprising:
a memory crossbar array comprising
a plurality of row lines;
a plurality of column lines;
a plurality of junctions arranged between the plurality of row lines and the plurality of column lines, wherein each junction comprises a programmable resistive element and an access element comprising an access terminal for accessing the programmable resistive element;
a signal generator configured to
apply programming signals to the resistive elements to program conductance values representing respective elements of the matrix to be multiplied with the vector;
a readout circuit configured to
apply read voltages to the row lines of the memory crossbar array, wherein the read voltages represent respective elements of the vector to be multiplied with the matrix;
read out current values of column lines of the memory crossbar array, wherein the current values represent respective elements of a product of the matrix-vector multiplication; and
control circuitry configured to control the signal generator and the readout circuit and to select by means of the access terminals a plurality of resistive elements in parallel according to a predefined selection scheme, wherein the predefined selection scheme is configured to
apply the programming signals and/or the read voltages in parallel to a plurality of resistive elements which do not share the same row line nor the same column line; and
apply the programming signals and/or the read voltages to at most one resistive element per row line and at most one resistive element per column line.

17. The design structure according to claim 16, wherein the junctions comprise a serial arrangement of a resistive element and an access transistor comprising a gate as access terminal.

18. The design structure according to claim 16, wherein the resistive element is embodied as projected memory, the projected memory comprising an integrated access terminal.

19. The design structure according to claim 16, wherein the selection scheme is configured to select in parallel resistive elements of one or more diagonals of the memory crossbar array, wherein the device comprises a plurality of diagonal access lines, wherein each of the plurality of diagonal access lines is coupled to the access terminals of an array of diagonally arranged resistive elements.

20. The design structure according to claim 16, wherein the junctions comprise a serial arrangement of a resistive element and an access transistor comprising a gate as access terminal, and wherein the device comprises a plurality of memory blocks, wherein an output of each memory block is coupled to at least one access transistor.

* * * * *